(12) United States Patent
Fang et al.

(10) Patent No.: US 6,797,340 B2
(45) Date of Patent: Sep. 28, 2004

(54) METHOD FOR DEPOSITING REFRACTORY METAL LAYERS EMPLOYING SEQUENTIAL DEPOSITION TECHNIQUES

(75) Inventors: Hongbin Fang, Mountain View, CA (US); Hyung-Suk A. Yoon, Santa Clara, CA (US); Ken Kaung Lai, Milpitas, CA (US); Chi Chung Young, Hsin Chu (TW); James Horng, Hsin Chu (TW); Ming XI, Palo Alto, CA (US); Michael X. Yang, Palo Alto, CA (US); Hua Chung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/268,195

(22) Filed: Oct. 10, 2002

(65) Prior Publication Data

US 2003/0104126 A1 Jun. 5, 2003

Related U.S. Application Data

(60) Provisional application No. 60/328,451, filed on Oct. 10, 2001.

(51) Int. Cl.[7] ................................................ C23C 8/00
(52) U.S. Cl. .................. 427/585; 427/250; 427/255.15; 427/255.17; 427/255.18; 427/255.21; 427/255.38; 427/255.39; 427/255.392; 427/255.394; 427/255.395; 427/255.7; 427/294; 427/299; 427/404; 427/419.7
(58) Field of Search ................................. 427/585, 250, 427/255.15, 255.18, 255.17, 255.21, 255.38, 255.39, 255.392, 255.394, 255.395, 255.7, 294, 299, 404, 419.7

(56) References Cited

U.S. PATENT DOCUMENTS

| 5,306,666 A | 4/1994 | Izumi ......................... 437/192 |
|---|---|---|
| 5,916,365 A | 6/1999 | Sherman ....................... 117/92 |
| 6,042,652 A | 3/2000 | Hyun et al. .................. 118/719 |

(List continued on next page.)

FOREIGN PATENT DOCUMENTS

| EP | 1167569 | 1/2002 | ......... C23C/16/455 |
| JP | 2001-111000 | 4/2001 | ......... H01L/27/105 |
| WO | 98/51838 | 11/1998 | ........... C23C/16/06 |
| WO | 00/54320 | 9/2000 | ........... H01L/21/44 |
| WO | 00/67936 | 11/2000 | |
| WO | 01/15220 | 3/2001 | ......... H01L/21/768 |
| WO | 01/27346 | 4/2001 | ........... C23C/16/44 |
| WO | 01/27347 | 4/2001 | ........... C23C/16/44 |
| WO | 01/29280 | 4/2001 | ........... C23C/16/32 |
| WO | 01/29891 | 4/2001 | ......... H01L/21/768 |
| WO | 01/29893 | 4/2001 | ......... H01L/21/768 |
| WO | 01/66832 | 9/2001 | ........... C30B/25/14 |
| WO | 02/45167 | 6/2002 | ........... H01L/27/00 |
| WO | 02/067319 | 8/2002 | ......... H01L/21/768 |

OTHER PUBLICATIONS

Klaus, et al. "Atomically controlled growth of tungsten and tungsten nitride using sequential surface reactions," Applied Surface Science 162–163 (2000) 479–491, No months avail.

*Primary Examiner*—Bernard Pianalto
(74) *Attorney, Agent, or Firm*—Moser Patterson & Sheridan (57) ABSTRACT

A method for forming a tungsten layer on a substrate surface is provided. In one aspect, the method includes positioning the substrate surface in a processing chamber and exposing the substrate surface to a boride. A nucleation layer is then deposited on the substrate surface in the same processing chamber by alternately pulsing a tungsten-containing compound and a reducing gas selected from a group consisting of silane ($SiH_4$), disilane ($Si_2H_6$), dichlorosilane ($SiCl_2H_2$), derivatives thereof, and combinations thereof. A tungsten bulk fill may then be deposited on the nucleation layer using cyclical deposition, chemical vapor deposition, or physical vapor deposition techniques.

20 Claims, 5 Drawing Sheets

U.S. PATENT DOCUMENTS

| | | | |
|---|---|---|---|
| 6,136,062 A | 10/2000 | Loffelholtz et al. | |
| 6,139,700 A | 10/2000 | Kang et al. | 204/192.17 |
| 6,200,893 B1 | 3/2001 | Sneh | 438/685 |
| 6,203,613 B1 | 3/2001 | Gates et al. | 117/104 |
| 6,207,487 B1 | 3/2001 | Kim et al. | 438/238 |
| 6,270,572 B1 | 8/2001 | Kim et al. | 117/93 |
| 6,284,646 B1 | 9/2001 | Leem | 438/629 |
| 6,287,965 B1 | 9/2001 | Kang et al. | 438/648 |
| 6,305,314 B1 | 10/2001 | Sneh et al. | 118/723 R |
| 6,333,260 B1 | 12/2001 | Kwon et al. | 438/643 |
| 6,342,277 B1 | 1/2002 | Sherman | 427/562 |
| 6,355,561 B1 | 3/2002 | Sandhu et al. | 438/676 |
| 6,358,829 B2 | 3/2002 | Yoon et al. | 438/597 |
| 6,368,954 B1 | 4/2002 | Lopatin et al. | 438/627 |
| 6,369,430 B1 | 4/2002 | Adetutu et al. | 257/382 |
| 6,372,598 B2 | 4/2002 | Kang et al. | 438/399 |
| 6,391,785 B1 | 5/2002 | Satta et al. | 438/704 |
| 6,399,491 B2 | 6/2002 | Jeon et al. | 438/680 |
| 6,420,189 B1 | 7/2002 | Lopatin | 438/2 |
| 6,423,619 B1 | 7/2002 | Grant et al. | 700/180 |
| 6,447,933 B1 | 9/2002 | Wang et al. | 428/635 |
| 6,451,119 B2 | 9/2002 | Sneh et al. | 118/715 |
| 6,451,695 B2 | 9/2002 | Sneh | 438/685 |
| 6,468,924 B2 | 10/2002 | Lee et al. | 438/763 |
| 6,475,276 B1 | 11/2002 | Elers et al. | 117/84 |
| 6,475,910 B1 | 11/2002 | Sneh | 438/685 |
| 6,482,262 B1 | 11/2002 | Elers et al. | 117/84 |
| 6,482,733 B2 | 11/2002 | Raaijmakers et al. | 438/633 |
| 6,482,740 B2 | 11/2002 | Soininen et al. | 438/686 |
| 6,534,395 B2 | 3/2003 | Werkhoven et al. | 438/627 |
| 2001/0000866 A1 | 5/2001 | Sneh et al. | 118/723 R |
| 2001/0002280 A1 | 5/2001 | Sneh | 427/255.28 |
| 2001/0009140 A1 | 7/2001 | Bondestam et al. | 118/725 |
| 2001/0009695 A1 | 7/2001 | Saanila et al. | 427/255.39 |
| 2001/0024387 A1 | 9/2001 | Raaijmakers et al. | 365/200 |
| 2001/0028924 A1 | 10/2001 | Sherman | 427/255.28 |
| 2001/0029094 A1 | 10/2001 | Mee-Young et al. | 438/597 |
| 2001/0034123 A1 | 10/2001 | Jeon et al. | 438/643 |
| 2001/0041250 A1 | 11/2001 | Werkhoven et al. | 428/212 |
| 2001/0054730 A1 | 12/2001 | Kim et al. | 257/301 |
| 2001/0054769 A1 | 12/2001 | Raaijmakers et al. | 257/758 |
| 2002/0000598 A1 | 1/2002 | Kang et al. | 257/301 |
| 2002/0004293 A1 | 1/2002 | Soininen et al. | 438/584 |
| 2002/0007790 A1 | 1/2002 | Park | 118/715 |
| 2002/0019121 A1 | 2/2002 | Pyo | 438/618 |
| 2002/0031618 A1 | 3/2002 | Sherman | 427/569 |
| 2002/0037630 A1 | 3/2002 | Agarwal et al. | 438/430 |
| 2002/0048880 A1 | 4/2002 | Lee | 438/253 |
| 2002/0052097 A1 | 5/2002 | Park | 438/507 |
| 2002/0055235 A1 | 5/2002 | Agarwal et al. | 438/430 |
| 2002/0061612 A1 | 5/2002 | Sandhu et al. | 438/151 |
| 2002/0076507 A1 | 6/2002 | Chiang et al. | 427/569 |
| 2002/0076837 A1 | 6/2002 | Hujanen et al. | 438/3 |
| 2002/0086507 A1 | 7/2002 | Park et al. | 438/585 |
| 2002/0090829 A1 | 7/2002 | Sandhu et al. | 438/761 |
| 2002/0094689 A1 | 7/2002 | Park | 438/694 |
| 2002/0105088 A1 | 8/2002 | Yang et al. | 257/774 |
| 2002/0106846 A1 | 8/2002 | Seutter et al. | 438/200 |
| 2002/0109168 A1 | 8/2002 | Kim et al. | 257/295 |
| 2002/0117399 A1 | 8/2002 | Chen et al. | 205/125 |
| 2002/0121697 A1 | 9/2002 | Marsh | 257/751 |
| 2002/0155722 A1 | 10/2002 | Satta et al. | 438/704 |
| 2002/0162506 A1 | 11/2002 | Sneh et al. | 118/715 |
| 2002/0182320 A1 | 12/2002 | Leskela et al. | 427/250 |
| 2002/0187256 A1 | 12/2002 | Elers et al. | 427/99 |
| 2002/0187631 A1 | 12/2002 | Kim et al. | 438/637 |
| 2003/0013320 A1 | 1/2003 | Kim et al. | 438/778 |
| 2003/0031807 A1 | 2/2003 | Elers et al. | 427/569 |
| 2003/0032281 A1 | 2/2003 | Werkhoven et al. | 438/640 |
| 2003/0049942 A1 | 3/2003 | Haukka et al. | 438/778 |
| 2003/0072975 A1 | 4/2003 | Shero et al. | 428/704 |

METHOD FOR DEPOSITING REFRACTORY METAL LAYERS EMPLOYING SEQUENTIAL DEPOSITION TECHNIQUES

CROSS-REFERENCE TO RELATED APPLICATION

This application is related to co-pending U.S. patent application Ser. No. 60/328,451, entitled "Method and Apparatus for Depositing Refractory Metal Layers Employing Sequential Deposition Techniques", filed on Oct. 10, 2001, which is incorporated by reference herein.

BACKGROUND OF THE DISCLOSURE

1. Field of the Invention

Embodiments of the invention relate to the processing of semiconductor substrates. More particularly, embodiments of the invention relate to deposition of refractory metal layers on semiconductor substrates.

2. Description of the Related Art

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical Vapor Deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates superior step coverage, compared to CVD, is cyclical Deposition. Cyclical deposition is based upon Atomic Layer Epitaxy (ALE) and employs chemisorption to deposit a saturated monolayer of reactive precursor molecules on a substrate surface. This is achieved by alternatingly pulsing an appropriate reactive precursor into a deposition chamber. Each injection of a reactive precursor is separated by an inert gas purge to provide a new atomic layer additive to previously deposited layers to form a uniform layer on the substrate. The cycle is repeated to form the layer to a desired thickness.

Formation of film layers at a high deposition rate while providing adequate step coverage are conflicting characteristics often necessitating the sacrifice of one to obtain the other. This conflict is true particularly when refractory metal layers are deposited to cover gaps or vias during the formation of contacts interconnecting adjacent metallic layers separated by dielectric layers. Historically, CVD techniques have been employed to deposit conductive material such as refractory metals in order to inexpensively and quickly form contacts. Due to the increasing integration of semiconductor circuitry, tungsten has been used based upon superior step coverage. As a result, deposition of tungsten employing CVD techniques enjoys wide application in semiconductor processing due to the high throughput of the process.

Depositing tungsten by traditional CVD methods, however, is attendant with several disadvantages. For example, blanket deposition of a tungsten layer on a semiconductor wafer is time-consuming at temperatures below 400° C. The deposition rate of tungsten may be improved by increasing the deposition temperature to, for example, about 500° C. to about 550° C. However, temperatures in this higher range may compromise the structural and operational integrity of the underlying portions of the integrated circuit being formed. Use of tungsten has also frustrated photolithography steps during the manufacturing process as it results in a relatively rough surface having a reflectivity of 20% or less than that of a silicon substrate. Further, tungsten has proven difficult to deposit uniformly. Poor surface uniformity typically increases film resistivity.

Therefore, there is a need for an improved technique to deposit conductive layers with good uniformity using cyclical deposition techniques.

SUMMARY OF THE INVENTION

Embodiments of the invention include an improved method for forming a tungsten layer on a substrate surface. In one aspect, the method includes positioning the substrate surface in a processing chamber, exposing the substrate surface to a boride, and depositing a nucleation layer in the same processing chamber by alternately pulsing a tungsten-containing compound and a reducing gas selected from a group consisting of silane ($SiH_4$), disilane ($Si_2H_6$), dichlorosilane ($SiCl_2H_2$), derivatives thereof, and combinations thereof.

In another aspect, the method includes exposing the substrate surface to a boride, depositing a nucleation layer in the same processing chamber by alternately pulsing a tungsten-containing compound and silane gas, and forming a bulk tungsten deposition film on the nucleation layer.

In yet another aspect, the method includes exposing the substrate surface to diborane, depositing a nucleation layer by alternately pulsing a tungsten-containing compound and silane gas, and forming a bulk tungsten deposition film on the nucleation layer. The bulk tungsten deposition film may be deposited using cyclical deposition, chemical vapor deposition, or physical vapor deposition techniques.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Embodiments of the invention provide an improved process for depositing tungsten films. The process utilizes a cyclical deposition technique and provides tungsten films having significantly improved surface uniformity and significantly increased production throughput. In one aspect, the process includes a boride soak prior to tungsten deposition to activate the underlying substrate surface. Preferably, the underlying surface is exposed to diborane ($B_2H_6$) although it is believed that any boride and derivatives thereof achieve similar results. In general, the boride soak occurs in-situ for about 5 to about 30 seconds at similar processing conditions as a subsequent tungsten cyclical deposition process, thereby significantly increasing production throughput.

A "substrate surface", as used herein, refers to any substrate surface upon which film processing is performed. For example, a substrate surface may include silicon, silicon oxide, doped silicon, germanium, gallium arsenide, glass, sapphire, and any other materials such as metals, metal nitrides, metal alloys, and other conductive materials, depending on the application. A substrate surface may also include dielectric materials such as silicon dioxide and carbon doped silicon oxides.

"Cyclical deposition" as used herein refers to the sequential introduction of two or more reactive compounds to deposit a mono layer of material on a substrate surface. The two or more reactive compounds are alternatively introduced into a reaction zone of a processing chamber. Each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay an inert gas, such as argon, is introduced into the processing chamber to purge the reaction zone or otherwise remove any residual reactive compound from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface.

Figure 1:
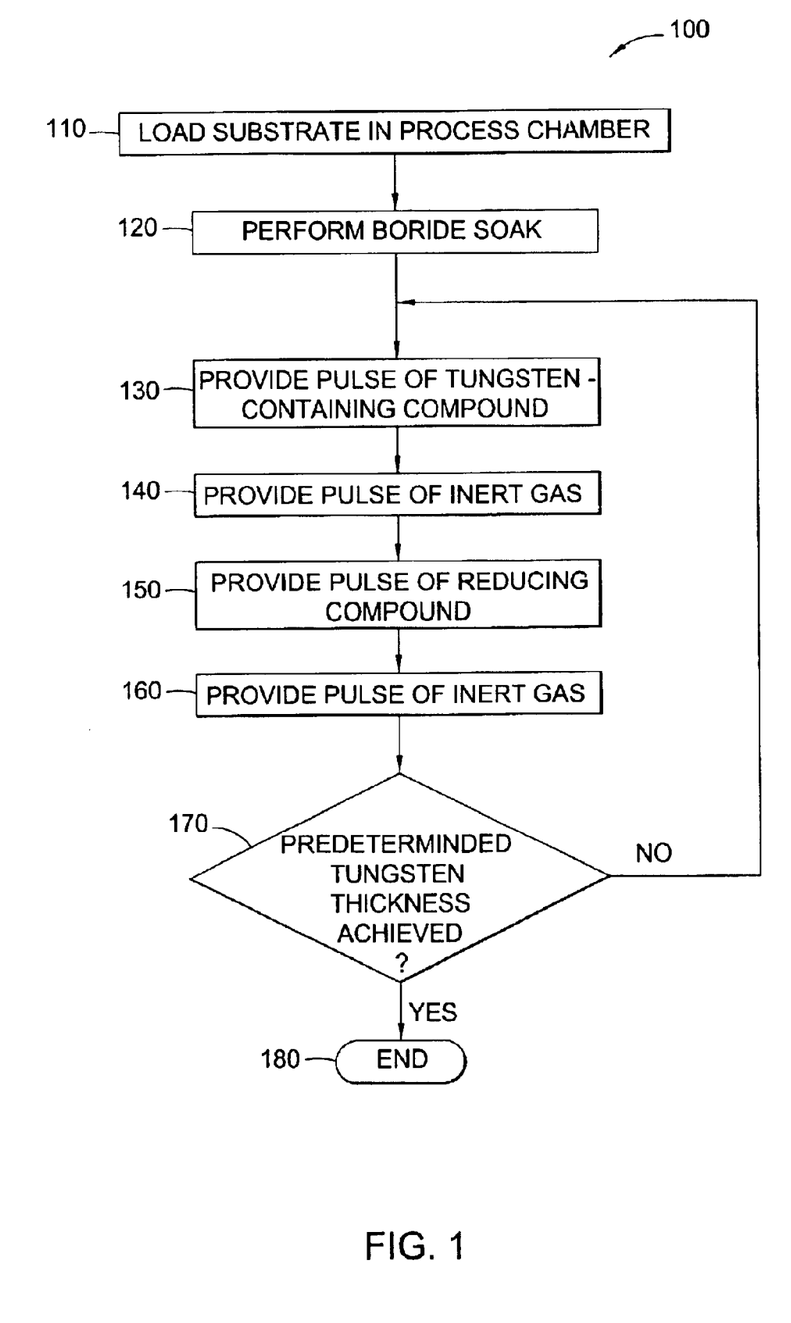
FIG. 1 illustrates a process sequence for the formation of a tungsten layer using a cyclical deposition technique according to one embodiment described herein.

FIG. 1 illustrates an exemplary process sequence 100 for forming an improved tungsten film according to one embodiment of the present invention. A substrate to be processed is first loaded into a process chamber capable of performing cyclical deposition and the process conditions are adjusted (step 110). The substrate is then exposed to one or more borides or derivatives thereof, such as diborane, for about 5 to about 30 seconds (step 120). At step 130, a pulse of a tungsten-containing compound accompanied with a suitable carrier gas is introduced into the processing chamber. A pulse of inert gas is then pulsed into the processing chamber (step 140) to purge or otherwise remove any residual tungsten-containing compound. Next, a pulse of a reducing compound accompanied with a suitable carrier gas is introduced into the processing chamber (step 150). The reducing gas may be the same compound as the gas used for the boride soak step (step 120) or alternatively, the reducing gas may be a different compound, depending on the product throughput requirements and the device applications. A pulse of inert gas is then introduced into the processing chamber (step 160) to purge or otherwise remove any residual reducing compound.

Suitable carrier gases include helium (He), argon (Ar), nitrogen ($N_2$), hydrogen ($H_2$), and combinations thereof. Typically, the boride utilizes argon as a carrier gas and the reducing compound uses hydrogen as the carrier gas. Useful purge gases include argon, helium, and combinations thereof.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto, and the volatility/reactivity of the particular compound itself.

Referring to step 170, after each deposition cycle (steps 130 through 160), a tungsten nucleation layer having a particular thickness will be deposited on the substrate surface. Usually, each deposition cycle forms a 7 angstrom (Å) to 8 Å layer of material. Depending on specific device requirements, subsequent deposition cycles may be needed to deposit tungsten nucleation layer having a desired thickness. As such, a deposition cycle (steps 130 through 160) can be repeated until the desired thickness for the tungsten film is achieved. Thereafter, the process is stopped as indicated by step 180 when the desired thickness is achieved.

Suitable tungsten-containing compounds include tungsten hexafluoride ($WF_6$) and tungsten carbonyl ($W(CO)_6$), among others, as well as combinations thereof. Suitable reducing compounds include, for example, silane ($SiH_4$), disilane ($Si_2H_6$), dichlorosilane ($SiCl_2H_2$), borane ($BH_3$), diborane ($B_2H_6$), triborane ($B_3H_9$), tetraborane ($B_4H_{12}$), pentaborane ($B_5H_{15}$), hexaborane ($B_6H_{18}$), heptaborane ($B_7H_{21}$), octaborane ($B_8H_{24}$), nanoborane ($B_9H_{27}$), decaborane ($B_{10}H_{30}$), and combinations thereof.

The cyclical deposition process of FIG. 1 typically occurs at a pressure between about 1 Torr and about 90 Torr at a temperature between about 200° C. and about 400° C. The boride soak step (step 120) is typically performed at about 1 Torr and at about 350° C. for about 10 seconds to about 1 minute. In one aspect, diborane is introduced with hydrogen, each having a flowrate between about 300 sccm and about 2,000 sccm. Preferably, the diborane and hydrogen gases are introduced in a 1:1 volumetric ratio. In step 130, the tungsten-containing compound is preferably tungsten hexafluoride ($WF_6$) and introduced at a rate of about 5 sccm to about 200 sccm with between about 100 sccm and about 1,000 sccm of argon. In step 150, the reducing compound is preferably diborane or silane and introduced at a rate between about 5 sccm and about 200 sccm with between about 100 sccm and about 1,000 sccm of hydrogen. The pulses of an inert gas, preferably argon, at steps 140 and 160, are typically introduced at a rate between about 100 sccm and about 1,000 sccm. Each processing step (steps 120 through 160) lasts about 30 seconds.

Figure 2:
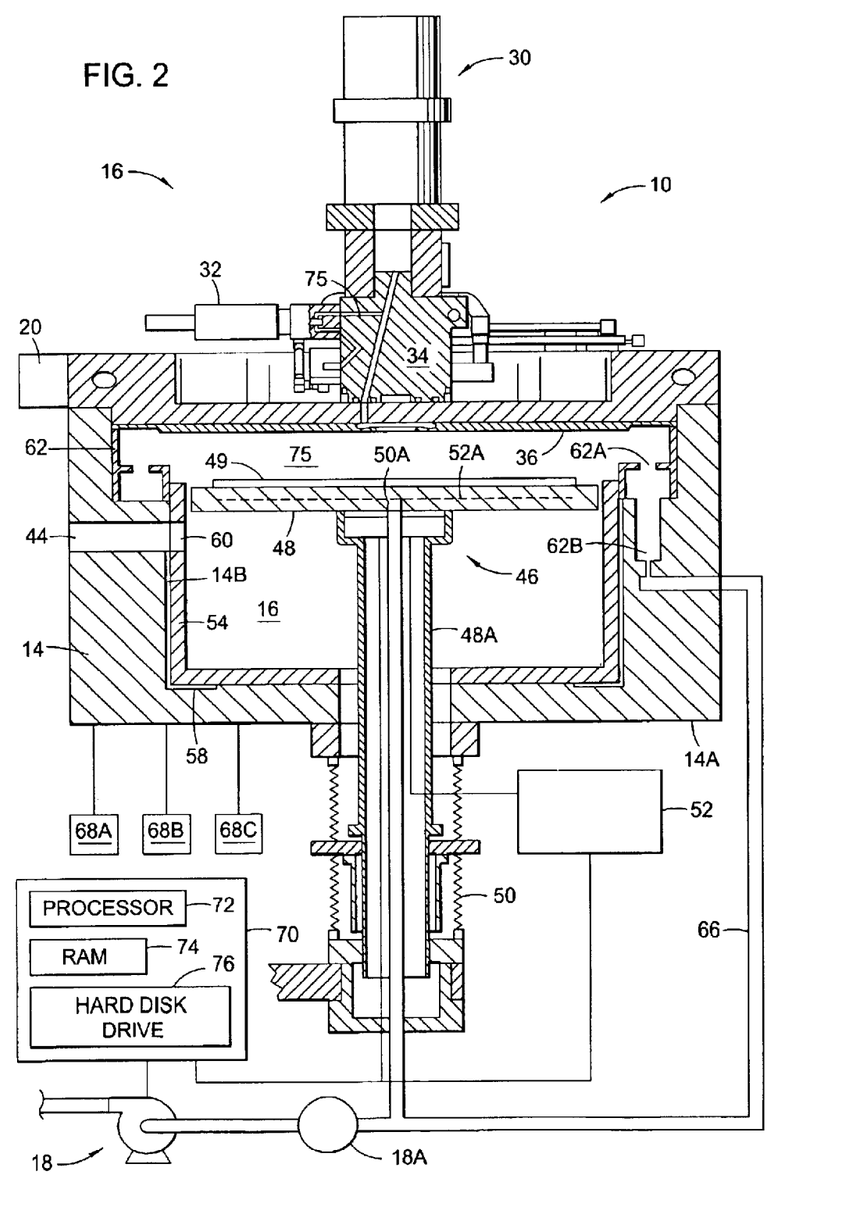
FIG. 2 depicts a schematic cross-sectional view of a process chamber useful for practicing the cyclical deposition techniques described herein.

FIG. 2 illustrates a schematic, partial cross section of an exemplary processing chamber 16 useful for depositing a tungsten layer according to the embodiments described above. Such a processing chamber 16 is available from Applied Materials, Inc. located in Santa Clara, Calif., and a brief description thereof follows. A more detailed description may be found in commonly assigned U.S. patent application Ser. No. 10/016,300, entitled "Lid Assembly For A Processing System To Facilitate Sequential Deposition Techniques", filed on Dec. 12, 2001, which is incorporated herein by reference.

Referring to FIG. 2, the processing chamber 16 includes a chamber body 14, a lid assembly 20 for gas delivery, and a thermally controlled substrate support member 46. The thermally controlled substrate support member 46 includes a wafer support pedestal 48 connected to a support shaft 48A. The thermally controlled substrate support member 46 may be moved vertically within the chamber body 14 so that a distance between the support pedestal 48 and the lid assembly 20 may be controlled. An example of a lifting mechanism for the support pedestal 48 is described in detail in U.S. Pat. No. 5,951,776, issued Sep. 14, 1999to Selyutin et al., entitled "Self-Aligning Lift Mechanism", which is hereby incorporated by reference in it entirety.

The support pedestal 48 includes an embedded thermocouple 50A that may be used to monitor the temperature thereof. For example, a signal from the thermocouple 50A may be used in a feedback loop to control the power applied by a power source 52 to a heater element 52A. The heater element 52A may be a resistive heater element or other thermal transfer device disposed within or disposed in contact with the pedestal 48 utilized to control the temperature thereof. Optionally, the support pedestal 48 may be heated using a heat transfer fluid (not shown).

The support pedestal 48 may be formed from any process-compatible material, including aluminum nitride and aluminum oxide ($Al_2O_3$ or alumina) and may also be configured to hold a substrate 49 thereon employing a vacuum, i.e. support pedestal 48 may be a vacuum chuck. Using a vacuum chuck, the support pedestal 48 may include a plurality of vacuum holes (not shown) that are placed in fluid communication with a vacuum source via the support shaft 48A.

The chamber body 14 includes a liner assembly 54 having a cylindrical portion and a planar portion. The cylindrical portion and the planar portion may be formed from any suitable material such as aluminum, ceramic and the like. The cylindrical portion surrounds the support pedestal 48. The cylindrical portion also includes an aperture 60 that aligns with the slit valve opening 44 disposed in a side wall 14B of the housing 14 to allow entry and egress of substrates from the chamber 16.

The planar portion of the liner assembly 54 extends transversely to the cylindrical portion and is disposed against a chamber bottom 14A of the chamber body 14. The liner assembly 54 defines a chamber channel 58 between the chamber body 14 and both the cylindrical portion and planar portion of the liner assembly 54. Specifically, a first portion of channel 58 is defined between the chamber bottom 14A and planar portion of the liner assembly 54. A second portion of channel 58 is defined between the sidewall 14B of the chamber body 14 and the cylindrical portion of the liner assembly 54. A purge gas is introduced into the channel 58 to minimize unwanted deposition on the chamber walls and to control the rate of heat transfer between the chamber walls and the liner assembly 54.

The chamber body 14 also includes a pumping channel 62 disposed along the sidewalls 14B thereof. The pumping channel 62 includes a plurality of apertures, one of which is shown as a first aperture 62A. The pumping channel 62 includes a second aperture 62B that is coupled to a pump system 18 by a conduit 66. A throttle valve 18A is coupled between the pumping channel 62 and the pump system 18. The pumping channel 62, the throttle valve 18A, and the pump system 18 control the amount of gas flow from the processing chamber 16. The size, number, and position of the apertures 62A in communication with the chamber 16 are configured to achieve uniform flow of gases exiting the lid assembly 20 over the support pedestal 48 having a substrate disposed thereon.

The lid assembly 20 includes a lid plate 20A having a gas manifold 34 mounted thereon. The lid plate 20A provides a fluid tight seal with an upper portion of the chamber body 14 when in a closed position. The gas manifold 34 includes a plurality of control valves 32 (only one shown) to provide rapid and precise gas flow with valve open and close cycles of less than about one second, and in one embodiment, of less than about 0.1 second. The valves 32 are surface mounted, electronically controlled valves. One valve that may be utilized is available from Fujikin of Japan as part number FR-21-6.35 UGF-APD. Other valves that operate at substantially the same speed and precision may also be used.

The lid assembly 20 further includes a plurality of gas sources 68A, 68B, 68C, each in fluid communication with one of the valves 32 through a sequence of conduits (not shown) formed through the chamber body 14, lid assembly 20, and gas manifold 34.

The processing chamber 16 further includes a reaction zone 75 that is formed within the chamber body 14 when the lid assembly 20 is in a closed position. Generally, the reaction zone 75 includes the volume within the processing chamber 16 that is in fluid communication with a wafer 102 disposed therein. The reaction zone 75, therefore, includes the volume downstream of each valve 32 within the lid assembly 20, and the volume between the support pedestal 48 and the lower surface of the lid plate 20. More particularly, the reaction zone 75 includes the volume between the outlet of each valve 32 and an upper surface of the substrate 49.

A controller 70 regulates the operations of the various components of the processing chamber 16. The controller 70 includes a processor 72 in data communication with memory, such as random access memory 74 and a hard disk drive 76 and is in communication with at least the pump system 18, the power source 52, and the valves 32.

Software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to the present invention. Alternatively, the software routines may be performed in hardware, as an application specific integrated circuit or other type of hardware implementation, or a combination of software or hardware.

Process Integration

A tungsten nucleation layer as described above has shown particular utility when integrated with traditional bulk fill techniques to form features with excellent film properties. An integration scheme can include cyclical deposition nucleation with bulk fill chemical vapor deposition (CVD) or physical vapor deposition (PVD) processes. Integrated processing systems capable of performing such an integration scheme include an Endura®, Endura SL®, Centura® and Producer® processing systems, each available from Applied Materials, Inc. located in Santa Clara, Calif. Any of these systems can be configured to include at least one cyclical deposition chamber for depositing the nucleation layer and at least one CVD chamber or PVD chamber for bulk fill.

Figure 3:
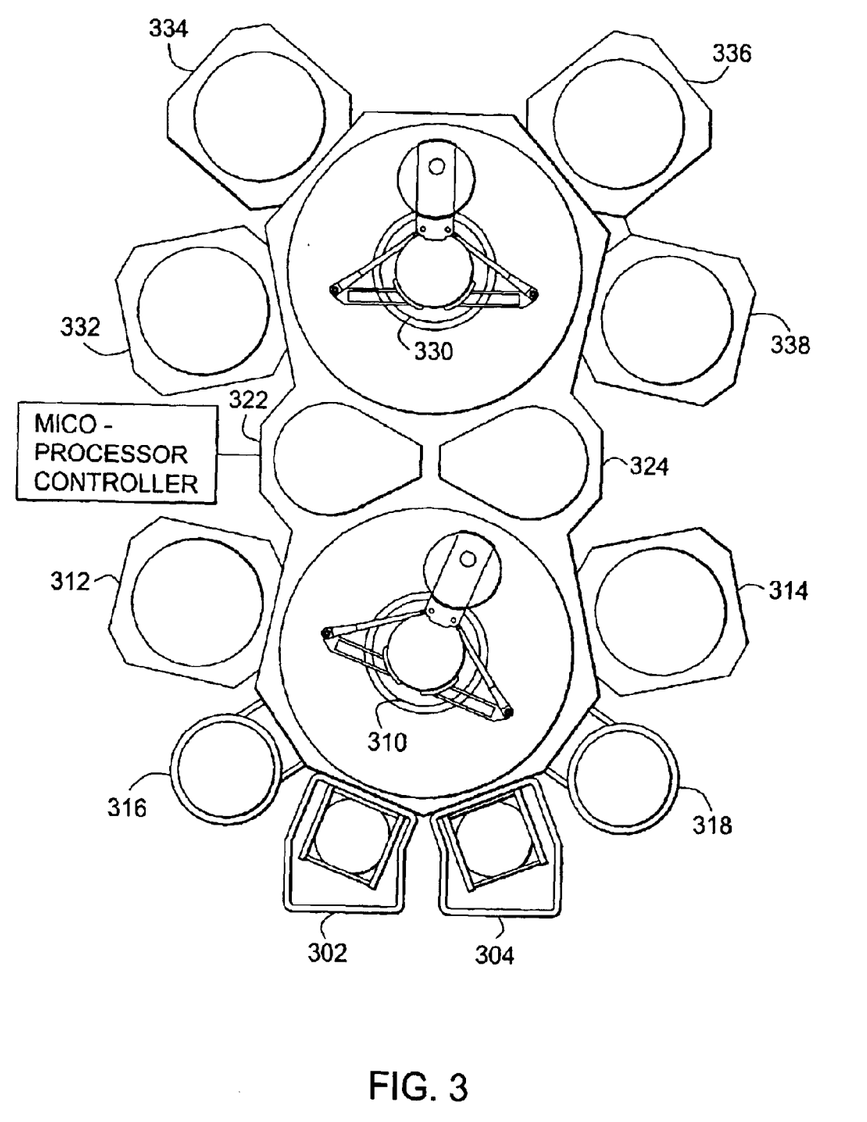
FIG. 3 shows an exemplary integrated processing platform.

FIG. 3 is a schematic top-view diagram of an exemplary multi-chamber processing system 300. A similar multi-chamber processing system is disclosed in U.S. Pat. No. 5,186,718, entitled "Stage Vacuum Wafer Processing System and Method," issued on Feb. 16, 1993, which is incorporated by reference herein. The system 300 generally includes load lock chambers 302, 304 for the transfer of substrates into and out from the system 300. Typically, since the system 300 is under vacuum, the load lock chambers 302, 304 may "pump down" the substrates introduced into the system 300. A first robot 310 may transfer the substrates between the load lock chambers 302, 304, and a first set of one or more substrate processing chambers 312, 314, 316, 318 (four are shown). Each processing chamber 312, 314, 316, 318, can be outfitted to perform a number of substrate processing operations such as cyclical layer deposition, chemical vapor deposition (CVD), physical vapor deposition (PVD), etch, pre-clean, degas, orientation and other substrate processes. The first robot 310 also transfers substrates to/from one or more transfer chambers 322, 324.

The transfer chambers 322, 324, are used to maintain ultrahigh vacuum conditions while allowing substrates to be transferred within the system 300. A second robot 330 may transfer the substrates between the transfer chambers 322, 324 and a second set of one or more processing chambers 332, 334, 336, 338. Similar to processing chambers 312, 314, 316, 318, the processing chambers 332, 334, 336, 338 can be outfitted to perform a variety of substrate processing operations, such as cyclical deposition, chemical vapor deposition (CVD), physical vapor deposition (PVD), etch, pre-clean, degas, and orientation, for example. Any of the substrate processing chambers 312, 314, 316, 318, 332, 334, 336, 338 may be removed from the system 300 if not necessary for a particular process to be performed by the system 300.

In one arrangement, each processing chamber 332 and 338 may be a cyclical deposition chamber adapted to deposit a nucleation layer; each processing chamber 334 and 336 may be a cyclical deposition chamber, a chemical vapor deposition chamber, or a physical vapor deposition chamber adapted to form a bulk fill deposition layer; each processing chamber 312 and 314 may be a physical vapor deposition chamber, a chemical vapor deposition chamber, or a cyclical deposition chamber adapted to deposit a dielectric layer; and each processing chamber 316 and 318 may be an etch chamber outfitted to etch apertures or openings for interconnect features. This one particular arrangement of the system 300 is provided to illustrate the invention and should not be used to limit the scope of the invention.

Another integrated system may include nucleation deposition as well as bulk fill deposition in a single chamber. A chamber configured to operate in both a cyclical deposition mode as well as a conventional CVD mode can be used. One example of such a chamber is described in U.S. patent application Ser. No. 10/016,300, filed on Dec. 12, 2001, which is incorporated herein by reference.

In another integration scheme, one or more cyclical deposition nucleation chambers are integrated onto a first processing system while one or more bulk layer deposition chambers are integrated onto a second processing system. In this configuration, substrates are first processed in the first system where a nucleation layer is deposited on a substrate. Thereafter, the substrates are moved to the second processing system where bulk deposition occurs.

Alternatively, a carousel type batch processing system having a plurality of stations in a single chamber can be adapted to incorporate nucleation and bulk layer deposition into a single processing system. In such a processing system a purge gas curtain, such as an argon gas curtain, can be established between each station creating a micro or mini environment at each station. The substrates are loaded into the system sequentially and then rotated through each station and processed at least partially at each station. For example, a substrate may be exposed to a cyclical deposition nucleation step at a first station and then to partial bulk fill CVD steps at each of the subsequent stations. Alternatively, nucleation may occur at more than one station and bulk fill may occur at one or more stations. Still further, the nucleation layer and the bulk layer may be deposited in separate carousel type systems. Each platen can be temperature controlled to provide at least some process control at each station. However, the process pressure typically remains the same between stations because the stations are housed in a single chamber. Some pressure control may be available in a micro or mini environment present at each station due to the inert gas curtain.

Regardless of the integration scheme, the nucleation layer is typically deposited to a thickness ranging from about 10 angstroms to about 200 angstroms and the bulk fill has a thickness between about 1,000 angstroms and about 10,000 angstroms. However, the thickness of these films can vary depending on the feature sizes and aspect ratios of a given application. Accordingly, the films are suitably sized to accommodate the geometries of a given application. The following are some exemplary geometries and applications that can benefit from a nucleation layer deposited according to embodiments described herein. The following descriptions are intended for illustrative purposes only, and are not intended to limit the uses of the present invention.

Tungsten Metal Gate

Figure 4:
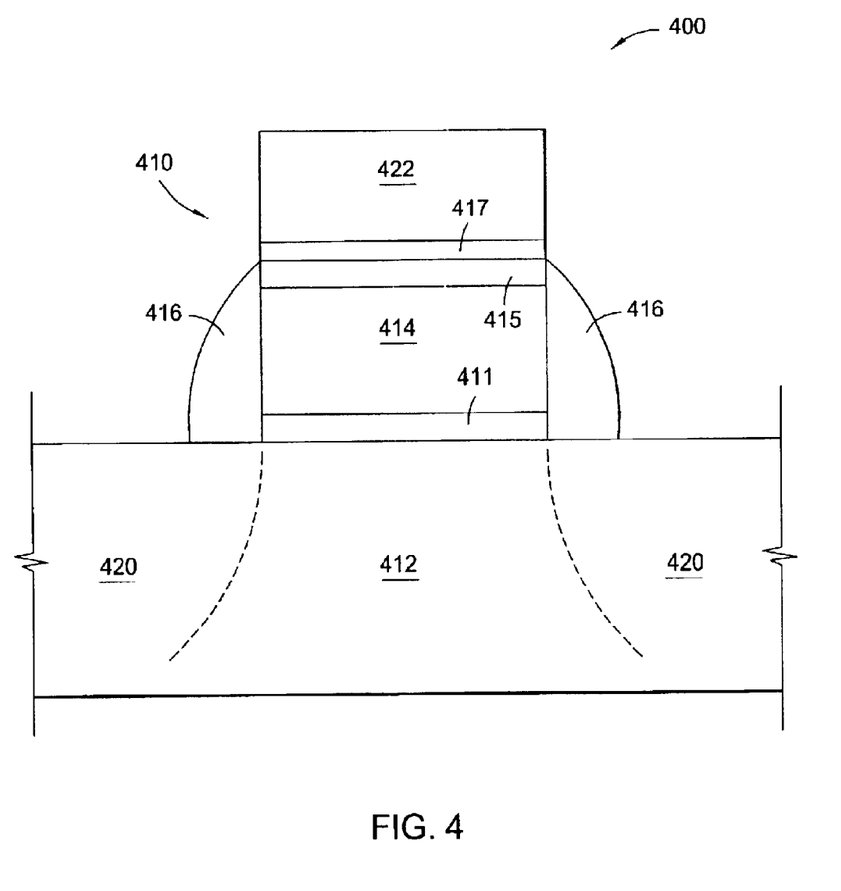
FIG. 4 shows a cross sectional view of an exemplary metal oxide gate device formed according to embodiments of the present invention.

FIG. 4 shows a cross sectional view of an exemplary metal oxide gate device 400 utilizing a nucleation layer deposited according to embodiments described herein. The device 400 generally includes an exposed gate 410 surrounded by spacers 416 and silicon source/drain areas 420 formed within a substrate surface 412. The spacers 416 typically include an oxide, such as silicon dioxide, or a nitride, such as silicon nitride.

The metal gate 410 includes an oxide layer 411, a polysilicon layer 414, a titanium nitride barrier layer 415, and a tungsten layer 422. The oxide layer 411 separates the substrate 412 from the polysilicon layer 414. The oxide layer 411 and the polysilicon layer 414 are deposited using conventional deposition techniques.

The titanium nitride barrier layer 415 is deposited on the polysilicon layer 414. The titanium nitride barrier layer 415 may be a bi-layer stack formed by depositing a PVD titanium layer followed by a CVD titanium nitride layer. The titanium barrier layer 415 may also be deposited using a cyclical deposition technique, such as the process shown and described in co-pending U.S. patent application Ser. No. 10/032,293, filed on Dec. 21, 2001, entitled "Chamber Hardware Design for Titanium Nitride Atomic Layer Deposition", which is incorporated by reference herein.

A nucleation layer 417 is then cyclically deposited over the barrier layer 415 following treatment of the substrate surface with the diborane soak process described above. In one aspect, the nucleation layer 417 is cyclically deposited using alternating pulses of tungsten hexafluoride ($WF_6$) and diborane ($B_2H_6$). The tungsten hexafluoride ($WF_6$) is pulsed at a rate of between about 10 sccm and about 400 sccm, such as between about 20 sccm and about 100 sccm, for about 30 seconds. A carrier gas, such as argon, is provided along with the tungsten hexafluoride at a rate of about 250 sccm to about 1000 sccm, such as between about 500 sccm to about 750 sccm. The diborane ($B_2H_6$) is pulsed at a rate of about 5 sccm and about 150 sccm, such as between about 5 sccm and about 25 sccm, for about 30 seconds. A carrier gas, such as hydrogen, is provided along with the diborane at a rate between about 250 sccm to about 1000 sccm, such as between about 500 sccm to about 750 sccm. The substrate is maintained at a temperature between about 250° C. and about 350° C. at a chamber pressure between about 1 torr and about 10 torr. In between pulses of the tungsten hexafluoride and the diborane, argon is pulsed for about 30 seconds to purge or otherwise remove any reactive compounds from the processing chamber.

In another aspect, the nucleation layer 417 is cyclically deposited using alternating pulses of tungsten hexafluoride ($WF_6$) and silane ($SiH_4$). The tungsten hexafluoride ($WF_6$) is pulsed as described above with argon for about 30 seconds. The silane ($SiH_4$) is pulsed at a rate of about 10 sccm to about 500 sccm, such as between about 50 sccm to about 200 sccm, for about 30 seconds. A carrier gas, such as hydrogen, is provided along with the silane at a rate of about 250 sccm and about 1000 sccm, such as between about 300 sccm and about 500 sccm. Argon is pulsed at a rate of about 300 sccm to about 1000 sccm, such as between about 500 sccm to about 750 sccm, for about 30 seconds between the pulses of the tungsten hexafluoride ($WF_6$) and the pulses of silane ($SiH_4$). The substrate is maintained at a temperature between about 300° C. and about 400° C. at a chamber pressure between about 1 torr and about 10 torr.

A nucleation layer formed by alternating pulses of tungsten hexafluoride ($WF_6$) and diborane without a boride soak treatment has advantages over a nucleation layer formed by alternating pulses of tungsten hexafluoride ($WF_6$) and silane. The diborane film shows lower stress for the integrated film and reduced fluorine content at the interface of the nucleation layer. The amorphous nature of the diborane film also permits thinner nucleation layers to be used, while maintaining good barrier properties. However, a nucleation layer formed by alternating pulses of tungsten hexafluoride ($WF_6$) and silane after a boride soak treatment, as described herein, eliminates the advantages the diborane deposition has over the silane deposition. Therefore, the nucleation layer 417 is preferably formed using alternating pulses of tungsten hexafluoride ($WF_6$) and silane following the diborane soak.

A tungsten bulk fill 422 is then deposited on the tungsten nucleation layer 417. Although any metal deposition process, such as conventional chemical vapor deposition or physical vapor deposition, may be used, the tungsten bulk fill 422 may be deposited by alternately adsorbing a tungsten-containing compound and a reducing gas as described above. A more detailed description of tungsten deposition using a cyclical deposition technique may be found in commonly assigned U.S. patent application Ser. No. 10/016,300, entitled "Lid Assembly For A Processing System To Facilitate Sequential Deposition Techniques", filed on Dec. 12, 2001; and in commonly assigned U.S. Patent Application No. (unknown), entitled "Deposition Of Tungsten Films For Dynamic Random Access Memory (DRAM) Application", filed on Feb. 20, 2002, which are both incorporated herein by reference.

Following deposition, the top portion of the resulting structure 400 may be planarized. A chemical mechanical polishing (CMP) apparatus may be used, such as the Mirra™ System available from Applied Materials, Santa Clara, Calif., for example. For example, portions of the tungsten bulk fill 422 are removed from the top of the structure leaving a fully planar surface. Optionally, the intermediate surfaces of the structure may be planarized between the deposition of the subsequent layers described above.

Logic Device

Figure 5:
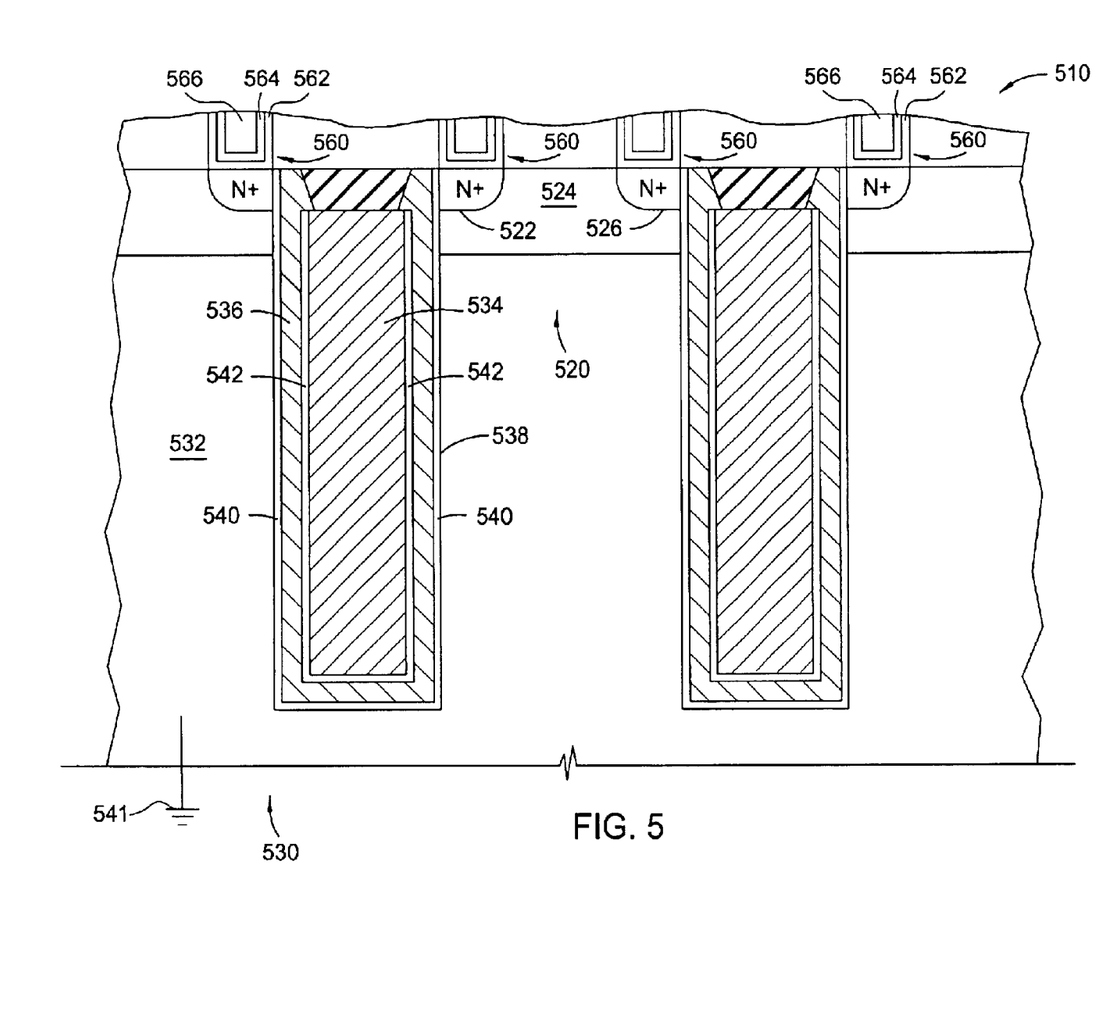
FIG. 5 shows a cross sectional view of a conventional DRAM device formed according to embodiments of the present invention.

FIG. 5 is a cross sectional view of a conventional DRAM device having a transistor 520 positioned adjacent a top portion of a trench capacitor 530. The access transistor 520 for the DRAM device 510 is positioned adjacent a top portion of the trench capacitor 530. Preferably, the access transistor 520 comprises an n-p-n transistor having a source region 522, a gate region 524, and a drain region 526. The gate region 524 is a P-doped silicon epi-layer disposed over the P+ substrate. The source region 522 of the access transistor 520 is an N+ doped material disposed on a first side of the gate region 524, and the drain region 526 is an N+ doped material disposed on a second side of the gate region 524, opposite the source region 522.

The source and drain regions 522, 524 may be connected to a tungsten plug 560. Each tungsten plug 560 includes a titanium liner 562, a tungsten nucleation layer 564, and a bulk tungsten fill 566. The titanium liner 562 may be a bi-layer stack comprising PVD titanium followed by CVD titanium nitride. The tungsten nucleation layer 564 is formed using the cyclical deposition technique as described above. The tungsten bulk fill 566 may be deposited using any conventional deposition technique.

The trench capacitor 530 generally includes a first electrode 532, a second electrode 534 and a dielectric material 536 disposed therebetween. The P+ substrate serves as a first electrode 532 of the trench capacitor 530 and is connected to a ground connection 541. A trench 538 is formed in the P+ substrate and filled with a heavily doped N+ polysilicon that serves as the second electrode 534 of the trench capacitor 530. The dielectric material 536 is disposed between the first electrode 532 (i.e., P+ substrate) and the second electrode 534 (i.e., N+ polysilicon).

The trench capacitor 530 also includes a first tungsten nitride barrier layer 540 disposed between the dielectric material 536 and the first electrode 532. Preferably, a second tungsten nitride barrier layer 542 is disposed between the dielectric material 536 and the second electrode 534. Alternatively, the barrier layers 540, 542 are a combination film, such as W/WN.

Although the above-described DRAM device utilizes an n-p-n transistor, a P+ substrate as a first electrode, and an N+ polysilicon as a second electrode of the capacitor, other transistor designs and electrode materials are contemplated by the present invention to form DRAM devices. Additionally, other devices, such as crown capacitors for example, are contemplated by the present invention.

EXAMPLE

A titanium (Ti) layer was deposited by PVD on a 200 mm substrate surface to a thickness of about 20 Å. A titanium nitride (TiN) layer was deposited on the Ti layer using an atomic layer deposition (ALD) process to a thickness of about 80 Å to form a Ti/TiN barrier layer. The substrate surface was then exposed to a diborane soak under the following conditions:

Pressure: about 1 Torr;
Temperature: about 350° C.;
Flowrates: 1500 sccm $B_2H_6$ and 1500 sccm $H_2$; and
Duration: about 10 seconds.

Next, a tungsten nucleation layer was formed on the barrier layer using the cyclical deposition techniques described herein. The nucleation layer had a thickness of about 100 Å. Finally, a bulk tungsten layer was deposited on the nucleation layer using CVD to a thickness of about 2,500 Å. The resulting tungsten bulk fill film exhibited a uniformity variance of less than about 2 percent.

COMPARATIVE EXAMPLE

A titanium (Ti) layer was deposited by PVD on a 200 mm substrate surface to a thickness of about 20 Å. A titanium nitride (TiN) layer was deposited on the Ti layer using an atomic layer deposition (ALD) process to a thickness of about 80 Å to form a Ti/TiN barrier layer. The substrate surface was then exposed to a silane soak under the following conditions:

Pressure: about 90 Torr;

Temperature: about 300° C.

Flowrates: 100 sccm $SiH_4$ and 500 sccm $H_2$; and

Duration: about 60 seconds.

Next, a tungsten nucleation layer was formed on the barrier layer using the cyclical deposition techniques described herein. The nucleation layer had a thickness of about 100 Å. Finally, a bulk tungsten layer was deposited on the nucleation layer using CVD to a thickness of about 2,500 Å. The resulting tungsten bulk fill film exhibited an uniformity variance greater than about 5 percent.

As shown by the examples above, the tungsten film deposited using a boride soak process exhibited an improved surface uniformity compared to a tungsten film deposited using a silane soak process. Further, the boride soak process is at least six times faster than the silane soak, which does not take into account the down time to pressurize the processing chamber to 90 Torr required by the silane soak treatment. Accordingly, the boride soak treatment of the present invention exhibits improved film uniformity and a significant increase in product throughput.

While the foregoing is directed to embodiments of the present invention, other and further embodiments of the invention may be devised without departing from the basic scope thereof, and the scope thereof is determined by the claims that follow.

What is claimed is:

1. A method for forming a tungsten layer on a substrate surface, comprising:

positioning the substrate surface in a processing chamber;

exposing the substrate surface to a boride; and depositing a nucleation layer in the same processing chamber by alternately pulsing a tungsten-containing compound and a reducing gas selected from a group consisting of silane ($SiH_4$), disilane ($Si_2H_6$), dichlorosilane ($SiCl_2H_2$), derivatives thereof, and combinations thereof.

2. The method of claim 1, wherein the nucleation layer is deposited by alternately pulsing tungsten hexafluoride and silane.

3. The method of claim 1, wherein the nucleation layer has a thickness of about 100 angstroms.

4. The method of claim 1, wherein the tungsten-containing compound is selected from the group consisting of tungsten hexafluoride, tungsten hexacarbonyl ($W(CO)_6$), and a combination thereof.

5. The method of claim 1, wherein the boride comprises borane ($BH_3$), diborane ($B_2H_6$), triborane ($B_3H_9$), tetraborane ($B_4H_{12}$), pentaborane ($B_5H_{15}$), hexaborane ($B_6H_{18}$), heptaborane ($B_7H_{21}$), octaborane ($B_8H_{24}$), nanoborane ($B_9H_{27}$) and decaborane ($B_{10}H_{30}$), derivatives thereof, and combinations thereof.

6. The method of claim 1, wherein exposing the substrate surface to a boride occurs at processing conditions of the nucleation layer deposition and lasts for about 30 seconds or less.

7. The method of claim 1, further comprising forming a bulk tungsten deposition film on the nucleation layer using cyclical deposition, chemical vapor deposition, or physical vapor deposition techniques.

8. The method of claim 1, wherein the nucleation layer is deposited by alternately pulsing tungsten hexafluoride and silane.

9. The method of claim 1, wherein exposing the substrate surface to a boride occurs at processing conditions of the nucleation layer deposition and lasts for about 30 seconds or less.

10. The method of claim 1, wherein the substrate surface comprises titanium nitride.

11. A method for forming a tungsten layer on a substrate surface, comprising:

exposing a substrate surface comprising titanium nitride to diborane for less than 30 seconds at about 1 to about 5 Torr and between about 300° C. and about 350° C.;

depositing a nucleation layer by alternately pulsing a tungsten-containing compound and silane gas at the same process conditions; and forming a bulk tungsten deposition film on the nucleation layer.

12. The method of claim 11, wherein exposing the substrate surface to diborane and depositing the nucleation layer occurs in the same chamber.

13. The method of claim 11, wherein the nucleation layer has a thickness between about 10 angstroms and about 200 angstroms.

14. The method of claim 11, wherein the bulk tungsten deposition film has a thickness between about 1,000 angstroms and about 2500 angstroms.

15. A method for forming a tungsten layer on a substrate surface, comprising:

positioning the substrate surface in a processing chamber;

exposing the substrate surface to a boride;

depositing a nucleation layer in the same processing chamber by alternately pulsing a tungsten-containing compound and silane gas; and forming a bulk tungsten deposition film on the nucleation layer.

16. The method of claim 15, wherein the nucleation layer has a thickness between about 10 angstroms and about 200 angstroms.

17. The method of claim 15, wherein the bulk tungsten deposition film has a thickness between about 1,000 angstroms and about 2500 angstroms.

18. The method of claim 15, wherein the tungsten-containing compound is selected from the group consisting of tungsten hexafluoride, tungsten hexacarbonyl ($W(CO)_6$), and a combination thereof.

19. The method of claim 15, wherein the boride comprises borane ($BH_3$), diborane ($B_2H_6$), triborane ($B_3H_9$), tetraborane ($B_4H_{12}$), pentaborane ($B_5H_{15}$), hexaborane ($B_6H_{18}$), heptaborane ($B_7H_{21}$), octaborane ($B_8H_{24}$), nanoborane ($B_9H_{27}$) and decaborane ($B_{10}H_{30}$), derivatives thereof, and combinations thereof.

20. The method of claim 15, wherein exposing the substrate surface to a boride occurs at processing conditions of the nucleation layer deposition and lasts for about 30 seconds or less.

* * * * *